US006661267B2

(12) United States Patent
Walker et al.

(10) Patent No.: US 6,661,267 B2
(45) Date of Patent: Dec. 9, 2003

(54) COARSE CALIBRATION CIRCUIT USING VARIABLE STEP SIZES TO REDUCE JITTER AND A DYNAMIC COURSE CALIBRATION (DCC) CIRCUIT FOR A 2 GHZ VCO

(75) Inventors: Norman Hugo Walker, San Diego, CA (US); Victor Moy, Poughkeepsie, NY (US); Allan Leslie Mullgrav, Jr., Wappingers Falls, NY (US); Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/139,931

(22) Filed: May 6, 2002

(65) Prior Publication Data

US 2003/0206042 A1 Nov. 6, 2003

(51) Int. Cl.[7] .................................................. H03L 7/06
(52) U.S. Cl. .................................... 327/159; 331/44
(58) Field of Search ......................... 331/10, 11, 14, 331/16, 17, 25, 44; 327/156, 157, 158, 159, 147, 148, 149, 150

(56) References Cited

U.S. PATENT DOCUMENTS

| 5,027,087 A | | 6/1991 | Rottinghans ............... 332/127 |
| 5,382,922 A | | 1/1995 | Gersbach et al. ............... 331/1 |
| 5,446,411 A | * | 8/1995 | Horsfall et al. ............. 329/325 |
| 5,508,660 A | | 4/1996 | Gersbach et al. ............. 331/17 |
| 5,604,465 A | * | 2/1997 | Farabaugh .................... 331/10 |
| 5,625,325 A | | 4/1997 | Rotzoll et al. ................ 331/16 |
| 5,686,864 A | | 11/1997 | Martin et al. ................. 331/1 |
| 5,696,468 A | | 12/1997 | Nise ............................. 331/14 |
| 5,703,540 A | * | 12/1997 | Gazda et al. ................. 331/16 |
| 5,909,149 A | | 6/1999 | Bath et al. ..................... 331/2 |
| 5,942,949 A | | 8/1999 | Wilson et al. ................ 331/17 |
| 6,175,282 B1 | | 1/2001 | Yasuda ........................ 331/44 |
| 6,222,402 B1 | | 4/2001 | Boerstler et al. ........... 327/157 |
| 6,275,115 B1 | * | 8/2001 | Egawa ........................ 331/11 |
| 6,304,122 B1 | | 10/2001 | Gregor et al. ............... 327/202 |
| 6,329,883 B1 | * | 12/2001 | Pacourek .................... 331/17 |

* cited by examiner

*Primary Examiner*—Kenneth B. Wells
*Assistant Examiner*—Cassandra Cox
(74) *Attorney, Agent, or Firm*—Graham S. Jones, II; H. Daniel Schnurmann

(57) ABSTRACT

A calibration system for a Phase Locked Loop (PLL) includes a phase/frequency detector coupled to the output of a voltage controlled oscillator (VCO) and to a source of a reference frequency. A charge pump is connected to receive an error signal from the phase/frequency detector and provide a voltage to a low pass filter. The low pass filter provides a filtered error signal to the VCO and to a comparator system. The comparator system provides a comparator output signal indicating when the polarity of the error signal exceeds a positive limit or a negative limit. A calibration means continuously provides incremental calibration inputs to the VCO, after a time delay. Thus the frequency of the VCO in the PLL is continuously corrected to compensate for frequency drift, and avoid jitter caused by an excessive rate of response to calibration inputs.

19 Claims, 8 Drawing Sheets

COARSE CALIBRATION CIRCUIT USING VARIABLE STEP SIZES TO REDUCE JITTER AND A DYNAMIC COURSE CALIBRATION (DCC) CIRCUIT FOR A 2 GHZ VCO

BACKGROUND OF THE INVENTION

1. Field of the Invention

This invention relates to phase-locked loops and more particularly to calibration circuits therefor.

2. Description of Related Art

Commonly assigned U.S. Pat. No. 5,508,660 of Gersbach et at for a "Charge Pump Circuit with Symmetrical Current Output for Phase-Controlled Loop System" shows a circuit which includes a charge pump connected between a phase comparator and a Voltage Controlled Oscillator (VCO). The output of the VCO is fed back in a phase-locked loop to the other input of the phase comparator. The phase comparator is connected to the feedback signal from the VCO and a source of a reference signal with a given input frequency. The output of the charge pump circuit is a current which is filtered by an RC filter that produces a control voltage based upon incrementing and decrementing signals received from the phase comparator. The control voltage across the RC filter is supplied to the input of the VCO. It is mentioned that a frequency divider can be interposed between the source of the reference signal, and the comparator, if desired. No means of calibration of the phase-controlled loop system is shown.

Commonly assigned U.S. Pat. No. 5,382,922 of Gersbach et at. for a "Calibration Systems and Methods for Setting PLL Gain Characteristics and Center Frequency" users two comparator inputs from a single filter voltage and performs a single pass calibration. There is a phase comparator connected to a source of a reference signal with a given input frequency. The output of the phase comparator is supplied to the input of a charge pump circuit. The output of the charge pump circuit is a current which is supplied in parallel to a calibration system and an RC filter that produces a control voltage based upon incrementing and decrementing signals from the charge pump. In this case, the output voltage from the filter is supplied to a Voltage-to-Current Converter VCC), the output of which is introduced to a summing node. The control voltage across the RC filter is supplied to the input of a VCO. The output of the VCO is fed back in a phase-locked loop to the other input of the phase comparator. The patent states that a frequency divider can be interposed between the source of the reference signal, and the comparator, if desired. The output of the calibration system is also supplied to the summing node. The output of the summing node is supplied to an oscillator which together with the voltage-to-current converter comprises a VCO. The calibration system includes calibration logic which receives inputs from a pair of comparators and produces an up signal when the control voltage is greater than a second reference voltage and a down signal when the control voltage is less than a first reference voltage. When the calibration cycle has resulted in the "High Order Counter Bits Unchanged For n Cycles", then the "calibration complete signal is issued . . . and processing terminates . . . " That is to say that the calibration is not continuous. The patent also states "Automated, repeated calibration of the PLL circuit is anticipated using the integrated, digital circuits described. An optimal voltage-frequency point is attained by the repeated calibration of the PLL to a center, steady state frequency."

The problem with the stopping of the cycle of calibration and then automated repeating of the process is that with the systems taught in the prior art, each time the calibration cycle is started, the system cannot handle data because of the jitter of the VCO during the intermittent or one time calibration process.

Commonly assigned U.S. Patent No. 6,175,282 of Yasuda for "Method for Calibrating a VCO Characteristic and Automatically Calibrated PLL Having a VCO" claims calibrating an oscillation frequency versus a control voltage characteristic of a VCO in which an oscillation frequency is changed in responsive to a control voltage, performing a calibration to establish an oscillation frequency in the VCO at a maximum target frequency value when a control input to the VCO reaches a reference voltage, and verifying that the control voltage is within an operating range when the oscillation frequency is established at a minimum target frequency value. The flow chart of the calibration process of Yasuda also ends two steps after the reference frequency is less than the control voltage, at the point at which "the oscillation frequency of is actually reduced to the lowest value ft L of the target frequency of the VCO . . . ", i.e. "fo=ft_L" and the flow chart indicates that the process ends at that point. There is no suggestion of a repetition of the process to maintain continuous calibration.

Additional references include U.S. Pat. No. 5,027,087 of Rottinghans for "Fast-Switching Frequency Synthesizer"; U.S. Pat. No. 5,625,325 of Rotzoll et al. for "System and Method for Phase Lock Loop Gain Stabilization"; U.S. Pat. No. 5,686,864 of Martin et al. for "Method and Apparatus for Controlling a Voltage Controlled Oscillator Tuning Range in a Frequency Synthesizer"; U.S. Pat. No. 5,909,149 of Bath et al. for "Multiband Phase Locked Loop Using a Switched Voltage Controlled Oscillator; and U.S. Pat. No. 5,942,949 of Wilson et al. for "Self-Calibrating Phase-Lock Loop with Auto-Trim Operations for Selecting an Appropriate Oscillator Operating Curve".

SUMMARY OF THE INVENTION

An object of this invention is to provide a system including a comparator circuit and calibration circuit which solve the problem of having to deal with Voltage Controlled Oscillator (VCO) frequency ("speed") drift due to temperature, voltage, and other environmental variations during operation. The dynamic nature of the DCC circuit of this invention functions better than static circuits that attempt to compensate for environmental changes.

To solve the problems of such variations, an object of the present invention is to provide a system capable of continuous recalibration of the PLL without causing errors due to jitter.

In accordance with this invention, a calibration system for a Phase Locked Loop (PLL) includes a phase/frequency detector coupled to the output of a voltage controlled oscillator (VCO) and to a source of a reference frequency. A charge pump receives an error signal from the phase/frequency detector and provides a voltage to a low pass filter. The low pass filter provides a filtered error signal to the VCO and to a comparator system. The comparator system provides a comparator output indicating when the polarity of the error signal exceeds a positive or negative limit. A calibration means for continuously providing incremental calibration inputs to the VCO after a time delay. Thus the frequency of the VCO in the PLL is continuously corrected to compensate for frequency drift and avoid jitter caused by an excessive rate of response to calibration inputs.

Preferably, the comparator system includes a high error comparator, a low error comparator and a positive-negative error comparator. The calibration means begins a calibration cycle by sampling the output of the comparator system at sampling times and then determines when an overlimit output has been received and then adjusts the calibration input by a small increment followed by powering down the comparator system for a delay time. The calibration means determines whether the calibration has corrected a detected error and repeats the correction cycle until correction of the error has been detected followed by returning to the beginning of the calibration cycle.

Preferably the VCO comprises a voltage to current (V-I) converter connected to provide an input to a current controlled oscillator (ICO), and the calibration means includes a Dynamic Course Correction (DCC) circuit and a Digital to Analog Converter (DAC) and the DAC provides an input to the ICO.

Preferably, the DAC includes means delaying the rate of change of incremental calibration input to the ICO.

Glossary

BIST Built-In Self Test

CALCOMP Calibration Comparators System including a set of three analog comparators that lock at the differential filter voltage from the FILTER and produce three digital outputs DIFF_HI, DIFF_LO and DIFF_POS.

CALCOMPS_PD Signal source is Analog. The signal powers down the CALCOMP system 20 by going high for all but 80 of the 31,250 cycles between sampling of the DIFF_HI, DIFF_LO, and DIFF_POS inputs (75 cycles before and 5 afterwards), Disables the CALCOMP system 20 when a logic "1".

CC_COMP Signal source is Corecntl. The signal indicates that VCOCTL macro circuit has completed the first calibration when high, i.e. when a logic "1" it denotes that the first coarse calibration has been completed.

CC_COUNT(8:0) Signal sources are Analog and Corecntl This is the six bit coarse calibration count value. Zero is the least significant bit. This calibration count value is converted in the IDAC 24 (FIG. 1) to a current.

CC_ERROR Signal source is Corecntl; Denotes if there is a calibration error., i.e. when a logic "1" it denotes that an error has occurred, either CC_COUNT<"0", or CC_COUNT>all "1's" was attempted CORECNTL Optional logic designed into chip to operate and/or test VCOCTL macro.

DCC Dynamic Coarse Calibration Circuit containing digital logic that implements the state diagrams shown in FIGS. 7 and 8

DIFF_HI Signal source is Analog. This signal tells the VCOCTL macro circuit to increment the CC_COUNT. Note, should not be high when DIFF_POS is low. It has a logic "1" value when ½* (Filter+−Filter−)>250 mV DIFF_LO Signal source is Analog. This signal tells the VCOCTL macro circuit to decrement the CC_COUNT. Note, should not be high when DIFF_POS is high. It has a logic "1"value when ½* (Filter+−Filter−)<−250 mV DIFF_POS Signal source is Analog. This signal tells the VCOCTL macro circuit when the VCO differential control voltage passes the zero point of the desired frequency. It is high when there is a positive control voltage and low when there is a negative control voltage It has a logic "1" value when Filter+>Filter−

DLPF Differential Low Pass Filter

DYNAMIC-EN Signal source is External. When this signal provides a logic"1", it enables the dynamic coarse calibration mode, whereas when this signal provides a logic "0", it enables single pass operation.

FILTER Differential low pass filter of the up and down charge current inputs supplied by the charge pump (Q-pump) Single-ended filter designs can also be used.

FILTP (Filter+) Positive (+) output from the low pass filter

FILTN (Filter−) Negative (−) output from the low pass filter

FREQ_OUT ($f_o$) Output frequency of VCO ($f_o$): $f_o=f_{ref}*$ N

FREQ_REF ($f_{ref}$) Reference frequency than is N times smaller than Freq. Out: $f_{ref}=f_o/N$ IDAC I (Current) Digital to Analog Converter 24 (FIG. 1)

INCC Signal source is from Corecntl. This signal increments the CC_COUNT by one (used for dynamic mode testing). Used for testing in a laboratory environment. When transitioning from a logic "0" to a logic "1", it increases the CC_COUNT output by a logic "1".

LSSD "Level Sensitive Scan Design" as described in commonly assigned Gregor U.S. Pat. No. 6,304,122 for "Low Power LSSD Flip Flops and a Flushable Single Clock Splitter for Flip Flops".

LSSDA Signal source is from Corecntl, LSSDA is a positive active clock. When TESTMODE is high, this input is used to clock the logic. When TESTMODE is low, this clock is forced low.

LSSDB Signal source is from Corecntl, LSSDB is also a positive active clock. When TESTMODE is low, this clock is forced high LSSDC Signal source is from Corecntl, LSSDC is also a positive active clock. As with LSSDB, when TESTMODE is high, this input is used to clock the logic. When TESTMODE is low, this clock is forced high.

N Positive integer which is the division value of the phase lock loop frequency divider P/F DETECT Phase/Frequency Detector compares $f_o/N$ to $f_{ref}$.

If $f_o/N>f_{ref}$, then an up pulse is given.

If $f_o/N<f_{ref}$, then a down pulse is given.

If $f_o$ and $f_{ref}$ are equal, then either both up and down pulses or neither are given.

PLL Phase Locked Loop

PWRDWN Powers down the DCC circuit when the signal is a logic "1". This signal is used in applications implemented with multiple DCC circuits and one may want to shut off idle DCC units to save power.

Q-PUMP Charge pump that either adds charge when an up signal is given or takes away charge when a down signal is given.

REFCLK Internal reference clock in DCC which is used to drive internal latches in DCC This is typically the system clock which is used to drive the DCC logic state machine that executes the single or dynamic operations.

RESET Reset signal that sets CC_COMP, CC_ERROR, and all CC_COUNT bits to "0"

SCANGATE Signal source is Corecntl. When SCANGATE is high, the LSSD clocks are used instead of the system clocks. This is used during manufacturing test to check for stuck faults. SCANGATE is low in normal operation and during module BIST testing.

SCANIN Signal source is Corecntl, LSSD scan data input.

REFCLK Signal source is External. This is the 33.3 MHz reference clock from the analog partition.

RESET Signal from Corecntl, the signal resets the state of the VCOCTL macro circuit when high.

SCANOUT Corecntl LSSD scan data output.

SLUMBER Link, when SLUMBER goes high, the VCOCTL macro circuit enters the slumber power mode (slumber state) and stays there until a set interval~1600 $\mu$s after SLUMBER goes low.

V+ ½* (Filter++Filter−)+250 mV
V− ½* (Filter++Filter−)−250 mV
VCOCTL macro circuit for controlling VCO frequency

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
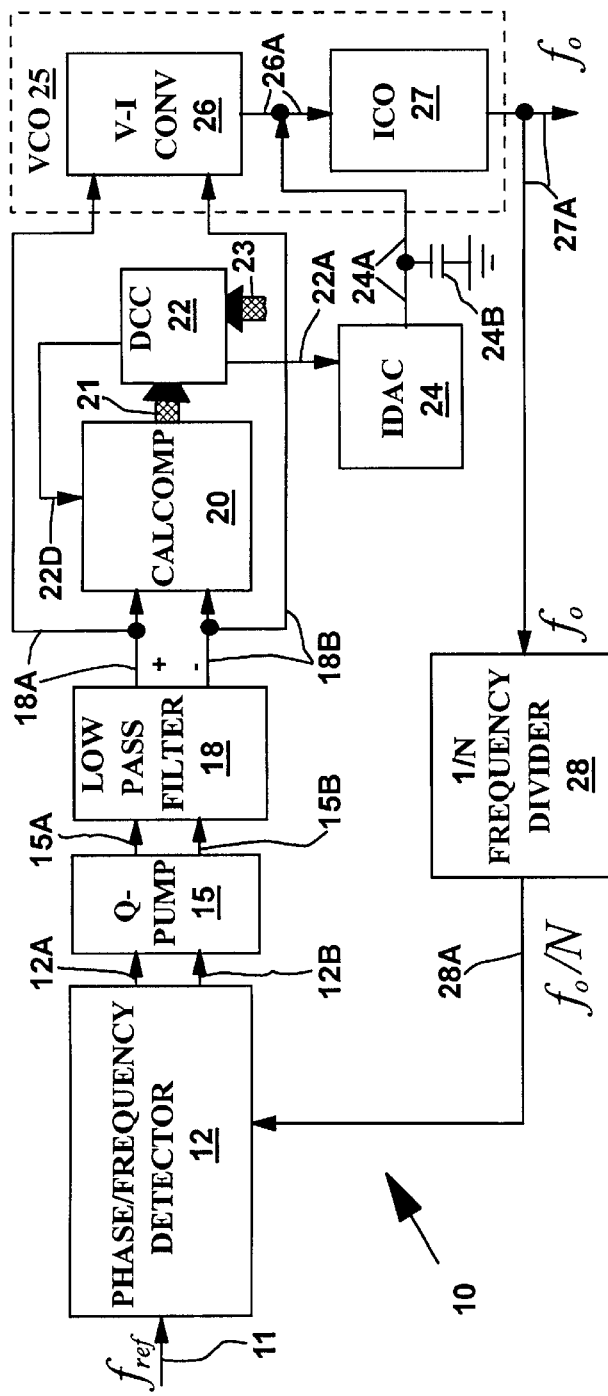
FIG. 1 shows a block diagram of a phase-locked loop (PLL) system in accordance with this invention adapted for controlling the frequency of a VCO in the PLL including a calibration comparison (CALCOMP) system and a Dynamic Coarse Calibration Circuit (DCC) for single pass and dynamic calibration of a PLL.

FIG. 1 shows a block diagram of a phase-locked loop system 10 in accordance with this invention adapted for controlling the frequency of a VCO 25 (shown in phantom) which has an output frequency $f_o$. Line 11 supplies a reference signal which has a reference frequency $f_{ref}$ to a phase/frequency detector 12. The reference frequency $f_{ref}$ is N times smaller than the output frequency $f_o$ where N is a positive number (i.e. an integer greater than zero). The phase/frequency detector 12 also receives on the return line 28A an input of the output frequency $f_o$ divided by N ($f_o/N$) from a 1/N Frequency Divider 28 . The phase/frequency detector 12 compares the reference frequency $f_{ref}$ input on line 11 with the divided VCO output frequency $f_o/N$ on the return line 28A. The phase/frequency detector 12 supplies an output signal on lines12A/12B to a Q (charge) pump 15. If the output frequency $f_o/N$ is greater than the reference frequency $f_{ref}$, then an up pulse is given on lines12A/12B to the charge pump 15. If the output frequency $f_o/N$ is less than the reference frequency $f_{ref}$, then a down pulse is given on lines12A/12B to the charge pump 15. If the frequencies $f_{ref}$ and $f_o/N$ are equal, then either of two results occurs, as follows:

1. neither an up pulse nor a down pulse is given to produce a neutral result, or
2. both and up pulse and a down pulse are given to produce a neutral result. In either case, the net result is that there is no change in charge on the charge pump 15 when the two frequencies $f_{ref}$ and $f_o/N$ are equal.

Figure 9:
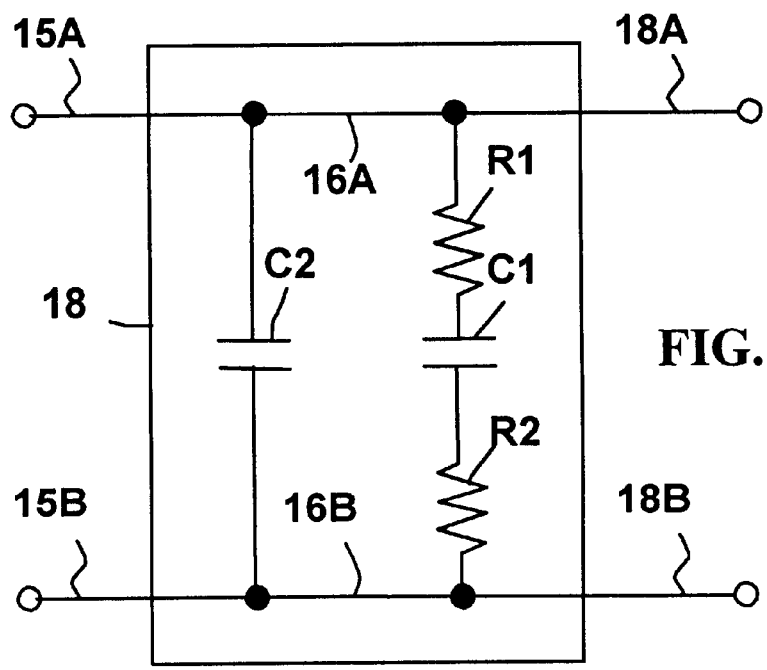
FIG. 9 is a circuit diagram of a Differential Low Pass Filter (DLPF) adapted for use in the system of FIG. 1.

The FILTP/FILTN outputs of the charge pump 15 are supplied on lines 15A/15B to a Differential Low Pass Filter (DLPF) 18 which supplies a Differential Control Voltage as an output on lines 18A/18B. The DLPF 18 comprises a differential, low pass filter of the up and down charge currents supplied by the charge pump 15 as shown in FIG. 9 which is described in more detail below.

Alternatively, a single-ended filter design such as the Low Pass Filter (LPF) shown in FIG. 10 and described below can be used. The Differential Control Voltage from the DLPF 18 is supplied on output lines 18A/18B to the two inputs of both the CALCOMP system 20 and the Voltage to Current (V-I) Converter 25.

Figure 3:
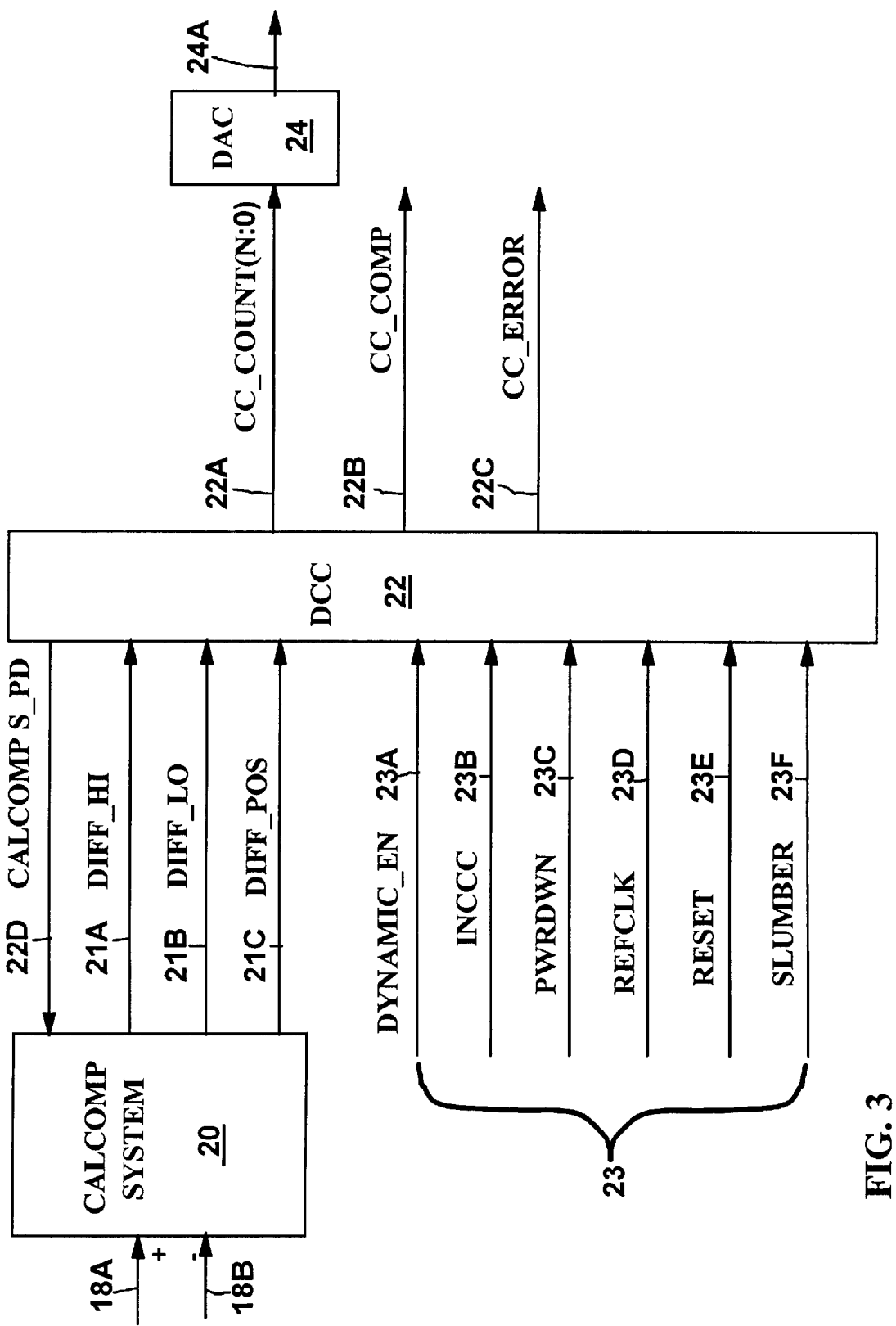
FIG. 3 is a block diagram which shows the CALCOMP system connected to other circuits in accordance with the embodiment of FIG. 1
Figure 4:
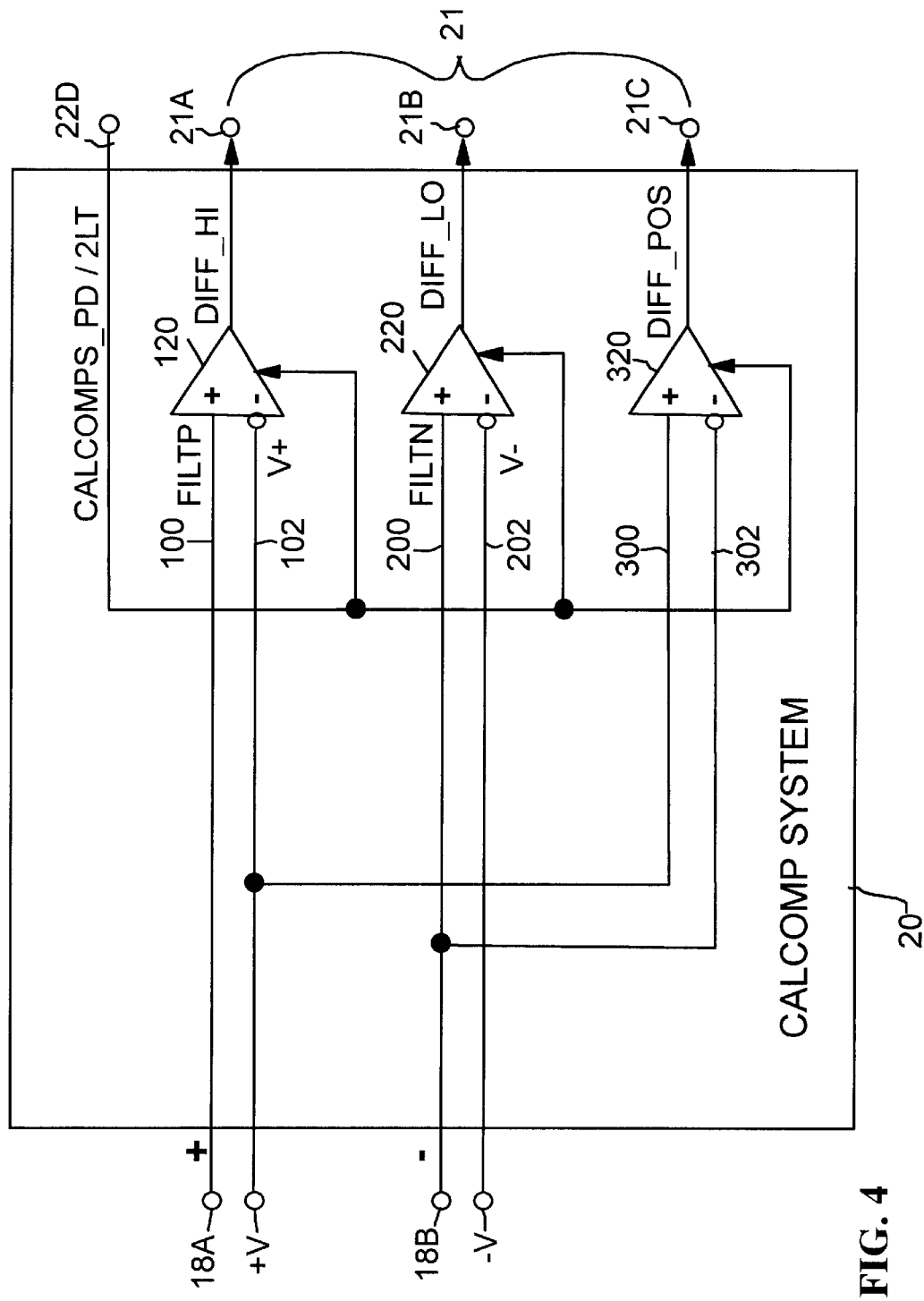
FIG. 4 is a block diagram of the CALCOMP system of FIGS. 1 and 3 showing the connections to the three analog comparators included therein.

FIG. 3 is a block diagram which shows the CALCOMP system 20 in context with other circuits. Referring to FIG. 4 a block diagram of the CALCOMP system 20 shows that the CALCOMP system 20 includes three analog comparators 120, 220, 320 that respond to the voltages on lines 18A/18B from the DLPF18 and in response thereto produces three digital outputs on the bus 21 which connects to the input to the Dynamic Course Calibration (DCC) circuit 22.

As shown in detail in FIG. 3 the connections between the CALCOMP 20 and the DCC circuit 22 via bus 21(include lines 21A, 21B and 21C, respectively comprising DIFF_HI on line 21A, DIFF_LO on line 21B and DIFF_POS on line 21C, which are described in more detail below in connection with the description of FIG. 4. The lines 21A, 21B and 21C are included in bus line 21.

The DCC circuit 22 produces a CC_COUNT output on line 22A to the I (Current) Digital to Analog Converter (IDAC) 24 which takes the nine bit output of the DCC circuit 22 on line 22A and converts it into an analog current for the an ICO 27 in the VCO 25. An important feature of the IDAC 24 is that the output signal therefrom is delayed by means such as the capacitor 24B connected from the output line 24A to ground which delays the current directed through line 24A to line 26A in the VCO 25, thereby assuring that the output of the IDAC 24 will produce very small changes slowly. The DAC 24A may incorporate delay circuits as well, as will be well understood by those skilled in the art. In addition, other time delays can be included between the CALCOMP 20 and the VCO 25 to assure that the continuous operation of the calibration function will not lead to jitter of the circuit.

Referring again to FIG. 1, the V-I Converter 26 takes the output voltages on lines 18A/18B from the DLPF 18 and produces a current proportional to the differential value between the output voltages from the DLPF 18 to supply one of two inputs on line 26A to the ICO 27.

The output frequency of the ICO 27 on line 27A (in the VCO 25) varies as a function of an increase/decrease in current from the combined currents from V-I converter 26 on line 26A and the of IDAC output 24 on line 24A which is connected to line 26A. The normal operation of the PLL utilizes the output from V-I converter 26 supplied thereto thru line 26A. The control of the VCO dynamic coarse calibration is achieved thru the IDAC output line 24A. The IDAC output on line 24A is designed to vary the input current to the ICO 27, slowly, in such a way that the V-I converter 26 can track this change accurately.

Figure 2:
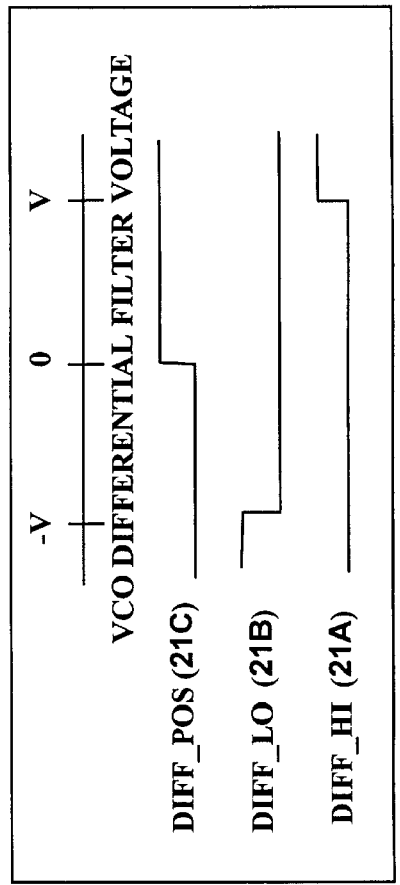
FIG. 2 shows three outputs signals DIFF_HI, DIFF_LO and DIFF_POS from the three comparators in the CAL-COMP system of FIG. 1 as a function of the differential control voltage from the output of a Differential Low Pass Filter (DLPF).

FIG. 2 shows the three outputs DIFF_HI on line 21A, DIFF_LO on line 21B and DIFF_POS on line 21C as a function of the Differential Control Voltage from lines 18A/18B. The CALCOMP system 20 generates the three outputs DIFF_HI on line 21A, DIFF_LO on line 21B and DIFF_POS on line 21C in response to the Differential Control Voltage from lines 18A/18B. FIG. 2 shows a minimum centered limit of −V (about −250 mV) and a maximum centered limit of +V (about +250 mV). DIFF_LO on line 21B is high if the Differential Control Voltage is below the minimum centered limit of −V and denotes the fact that the VCO frequency is too high. DIFF_HI on line 21A is high if the Differential Control Voltage is above the maximum centered limit of +V and denotes the fact that the VCO frequency is too low. DIFF_POS on line 21C is high if the Differential Control Voltage is positive and is low if the Differential Control Voltage is negative. The +/−V buffer zone around a zero (0) value for the Differential Control Voltage equates to about 24+ CC_COUNTs in the positive and negative direction.

As indicated above, the DIFF_HI signal tells the VCOCTL macro circuit to increment the CC_COUNT. Note that DIFF_HI should not be high when DIFF_POS is low, and it has a logic "1" value when ½* (Filter+−Filter−) >250 mV. The DIFF_LO signal tells the VCOCTL macro circuit to decrement the CC_COUNT. Note, that DIFF_LO should not be high when DIFF_POS is high, and it has a logic "1" value when ½* (Filter+−Filter−)<−250 mV. The DIFF_POS signal tells the VCOCTL macro circuit when the VCO differential control voltage passes the zero point of the desired frequency. The DIFF_POS signal is high when there is a positive control voltage and low when there is a negative control voltage, and it has a logic "1" value when Filter+>Filter−

Calibration Comparators Macro Circuit (CALCOMP)

Overview

Referring to FIG. 4, the CALCOMP system 20 includes the Calibration Comparators (CALCOMP) system 20 creates three critical outputs in response to voltage +V, −V and the FILTER voltage input levels FILTP input on line 18A and the FILTN input on line 18B from the DLPF filter 18. The three output signal values form the CALCOMP system 20 on bus lines 21 are the DIFF_HI output on line 21A , DIFF_LO output on line 21B, and DIFF_POS output on line 21C which are used in conjunction with Coarse Calibration logic in the DCC 22 of FIG. 3 to form a "secondary PLL loop" which compensates for changes in PROCESS, TEMP, and VDD.

The DIFF_POS output on line 21C is derived from a standard CMOS comparator 320 directly comparing the FILTER inputs FILTP on line 18A and FILTN on line 18B. When the positive FILTP input on line 18A is greater than the negative FILTN, input on line 18B the DIFF POS signal output is a logic '1'. Otherwise the DIFF_POS signal output is a logic '0'.

The DIFF_HI output on line 21A and DIFF_LO output on line 21B come from two offset comparators 120/220. The DIFF_HI output on line 21A is a logic '1' when the differential FILTER input FILTP on line 100 exceeds +V (+250 mV) on line 102 into the comparator 120. Similarly, DIFF_LO output on line 21B is a logic '1' when the differential FILTER input FILTN on line 200 falls below −V (−250 mV) on line 202 into the comparator 220. A closed loop Op-Amp circuit is used to derive a differential voltage around the filter common-mode voltage. This voltage is applied to a replica circuit that generates an offset voltage reference. Then, this offset reference voltage is connected to two CMOS comparators which complete the offset comparator. The three comparators 120/220/320 of the CALCOMP 20 are all turned off between sampling times when the input signal CALCOMPS_PD on line 22D from the DCC circuit 22 goes high.

In order to comply with current (I) Drain to Drain Quiescent (IDDQ) testing (monitoring static current) measurements during wafer and module final test, the LT input provides IDDQ testing control. The ZLT output is used to daisy chain to the LT input of another analog circuit.

Referring to FIG. 3 the sub-system shown including the Dynamic Course Calibration (DCC) circuit 22 in accordance with this invention solves the problem of VCO frequency ("speed") drift due to temperature, voltage, and other environmental variations during operation by incrementing a digital course calibration value based upon three inputs including DIFF_HI on line 21A, DIFF_POS on line 21B, and DIFF_LO on line 21C. The three inputs DIFF_HI on line 21A, DIFF_LO on line 21B, and DIFF_POS on line 21C are generated by the Calibration Comparator (CALCOMP) circuit 20 that compares the control voltage into the VCO 25 on lines 18A/18B to a −V/0/+V range. If the control voltage is too low <−V, the value of DIFF_LO=1 on line 21B. In that case, because the VCO 25 is operating "too fast", i.e. at too high a frequency, for the purpose of lowering the frequency of operation, the DCC circuit 22, decrements the course calibration count CC_COUNT on line 22A. If the control voltage is too high (>+V, the value of DIFF_HI=1 on line 21A) then the VCO 25 is operating "too slow" at too low a frequency. Thus, to raise the frequency of operation, the DCC circuit 22 increments the course calibration count CC_COUNT on line 22A. The DIFF_POS output on line 21C from CALCOMP system 20 in FIGS. 1, 3 and 4 signals the DCC circuit 22 when it is time to stop decrementing/incrementing. The DIFF_POS output on line 21C is "1" when the control voltage is greater than zero (>0) and "0" when it is less than zero (<0). Thus, when the DIFF_POS output on line 21C changes from its current state, that tells the DCC circuit 22 to stop incrementing or decrementing. There is a maximum count of 1111111 and a minimum count of 0000000, if inputs tell it to exceed the maximum or minimum values then an error is flagged and the DCC circuit 22 stops working.

This VCOCTL macro circuit in the DCC circuit 22 performs the coarse calibration for the VCO 25 (i.e. calibration of the ICO 27). Calibration of the VCO 25 is provided in either a continuous dynamic method or a single pass method. This calibration is performed by looking at three inputs 21A/21B/21C that come from three comparators 120/220/320 in the CALCOMP system 20 in FIG. 4 that in turn look at the DLPF outputs 18A/18B. Based upon the differential voltages on lines 18A/18B, the coarse calibration CC_COUNT value is incremented or decremented on line 22A in FIGS. 1 and 3 to center the VCO filter voltage and thus to center the VCO 25 (ICO 27) at the correct frequency. Initially, this calibration circuit also counts by a larger value to save time and lock faster, and then by a single increment or decrement to reduce jitter produced by changing the coarse calibration value on line 22A to the IDAC 24.

The DCC circuit 22 has the following features. 1. It allows dynamic or single pass calibration. 2. It detects a maximum/minimum error. 3. It samples the three inputs of comparators 120/220/320 to center the frequency exactly. 4. It counts by large steps initially to reduce lock time, followed by single steps to reduce jitter and improve accuracy. 5. It allows count user to increase count value to test jitter effects in a laboratory. 6. It has two power states "Partial" & "Slumber" that store the current CC_COUNT value. 7. It has a power off mode that halts operation, but keeps the current value. 7. It disables the power to the CALCOMP system 20 via CALCOMPS_PD input line 22D to save power.

0.1. VCOCTL Macro Circuit in DCC 0.1.1. VCOCTL Macro Circuit Overview

The VCOCTL macro circuit in the DCC circuit 22 performs the coarse calibration for the VCO 25. The function of calibration of the VCO 25 is provided in either a continuous dynamic method or a single pass method. The dynamic method is selected when the DYNAMIC_EN value on line 23A to the DCC circuit 22 is high and the single pass method is selected when the DYNAMIC_EN value on line 23A is low.

Based upon the DIFF_LO, DIFF_HI, and DIFF_POS inputs on lines 21A, 21B and 21C from the CALCOMP system 20, the CC_COUNT on line 22A of IDAC 24 in FIGS. 1 and 3 is decremented or incremented (initially by eight then by one after CC_COMP goes high) until VCO differential control voltage between line 18A and line 18B from the DLPF 18 is nearly centered (DIFF_POS is near its transition point). The CALCOMP 20 is powered down for all but 33 cycles before and 3 cycles after the inputs are sampled via the CALCOMPS_PD signal on line 22D from the DCC circuit 22 going high. If the first calibration is successful, the value of CC_COMP on line 22B in FIG. 3 goes high and stays high unless the VCOCTL macro circuit in the DCC circuit 22 is reset. The VCOCTL macro circuit is reset using the RESET signal line 23E on control bus 23, which clears all counters in the DCC circuit 22 and resets the state to the centered state. Because the CC_COUNT on line 22A needs to change at a slow rate (−417 microseconds), a 14-bit counter is used to slow state changes based upon the 33.3 MHz clock input (counts 13,888 cycles).

0.1.2. VCOCTL Macro Circuit Input Description

Three key inputs that control the operation of the VCOCTL macro circuit are DIFF_HI on line 21A, DIFF_LO on line 21B, and DIFF_POS on line 21C. These three signals are generated by three separate analog comparators 120/220/320 in the CALCOMP system 20 shown in FIG. 4. Referring to FIG. 2, and examining the VCO control voltage, as stated above, DIFF_LO on line 21B is high if the Differential Control Voltage is below the minimum centered limit −V and denotes the fact that the VCO frequency is too high. DIFF_HI on line 21A is high if the Differential Control Voltage is above the maximum centered limit +V and denotes the fact that the VCO frequency is too low. DIFF_POS on line 21C is high if the Differential Control Voltage is positive and is low if the Differential Control Voltage is negative.

0.1.3. VCOCTL Macro Circuit Single Pass Operation

In the single pass operation of the VCOCTL macro circuit, a single attempt to calibrate the VCO is initiated. The CC_COUNT on line 22A is set to 000000000 when RESET is set high, so the VCOCTL macro circuit in the DCC 22 will increase CC_COUNT by steps of eight until the VCO control voltage is centered (DIFF_POS on line 21C goes too low). Once the VCO control voltage is centered, CC_COMP is set high. An error signal CC_ERROR is set high if CC_COUNT is 111111111 and DIFF_POS is still low.

The single pass operation of the VCOCTL macro circuit, which can be implemented with a microprocessor as will be well understood by those skilled in the art, is explained in detail with reference to the flow chart shown in FIG. 5. Further explanation is provided below with respect to the corresponding state diagram shown in FIG. 6.

Figure 5:
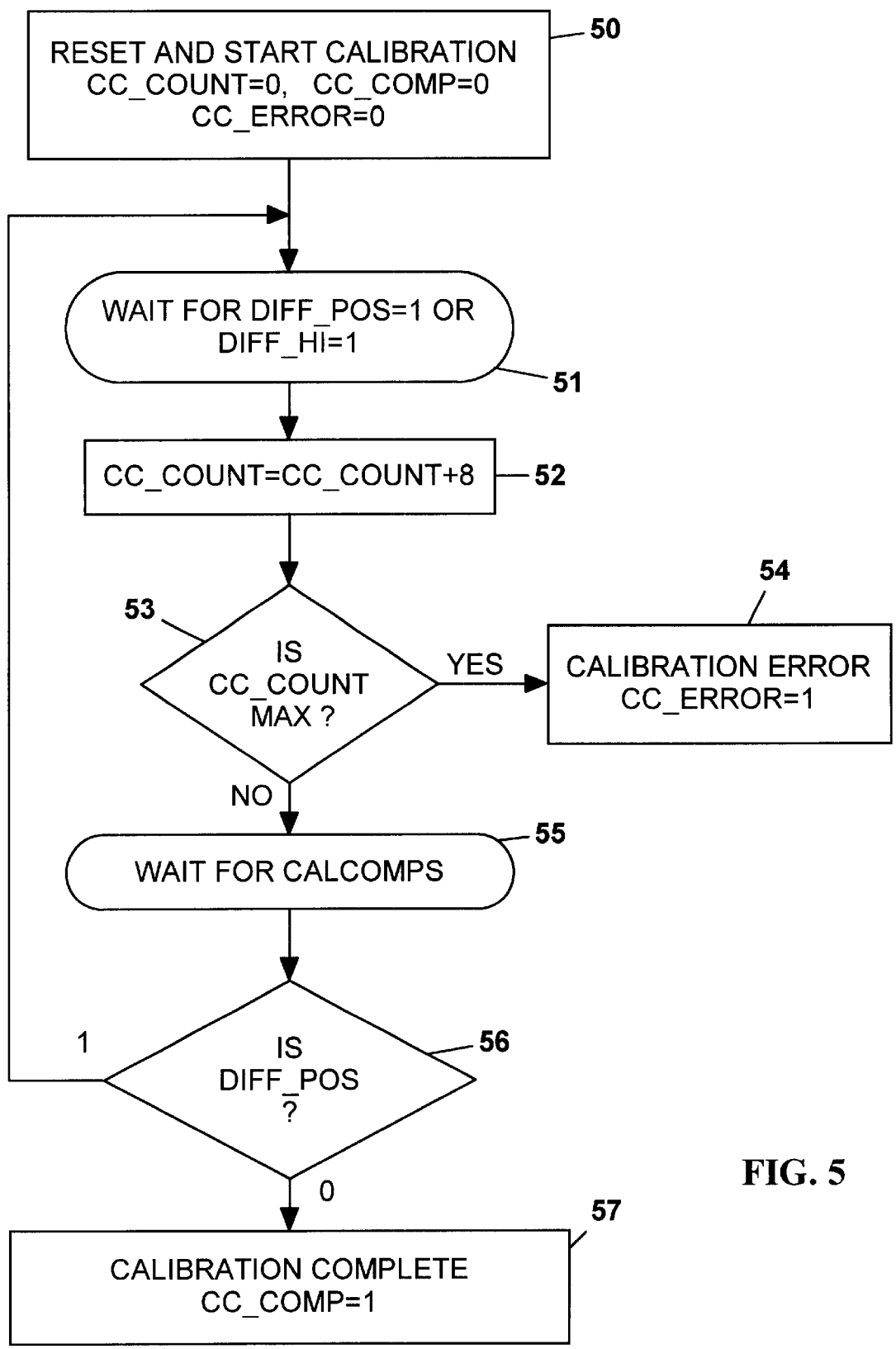
FIG. 5 is a flow chart of the single pass operation of the VCOCTL macro circuit of the DCC.

In FIG. 5, the system or the microprocessor starts in block 50 by performing the functions as follows:

RESET AND START CALIBRATION

CC_COUNT=0 CC_COMP=0 CC_ERROR=0

Then the system proceeds to block 51 which performs the functions as follows:

WAIT FOR DIFF_POS=1 OR

DIFF_HI=1

This delay slows the system down to a degree appropriate to permit cycling of the system during calibration of the VCO without overcorrecting and causing jitter.

Next, the system proceeds to block 52 which increments the CC_COUNT by +8 as follows:

CC_COUNT=CC_COUNT+8

Then the system proceeds to decision block 52 which tests to determine the answer to this question as follows:

IS CC_COUNT MAX?

If YES, then the system branches to block 54 to indicate to the system as follows:

CALIBRATION ERROR

CC_ERROR=1

If NO, then in block 55 the system is instructed as follows:

WAIT FOR CALCOMPS

This delay also slows the system down to a degree appropriate to permit cycling of the system during calibration of the VCO without overcorrecting and causing jitter.

Then the system proceeds to decision block 56 which tests as follows:

IS DIFF_POS?

If the answer is "1" (YES) then the system loops back to block 51, but if the answer is "0" (NO) then the system proceeds to block 57 to indicate to the system as follows:

CALIBRATION COMPLETE

CC_COMP=1

Figure 6:
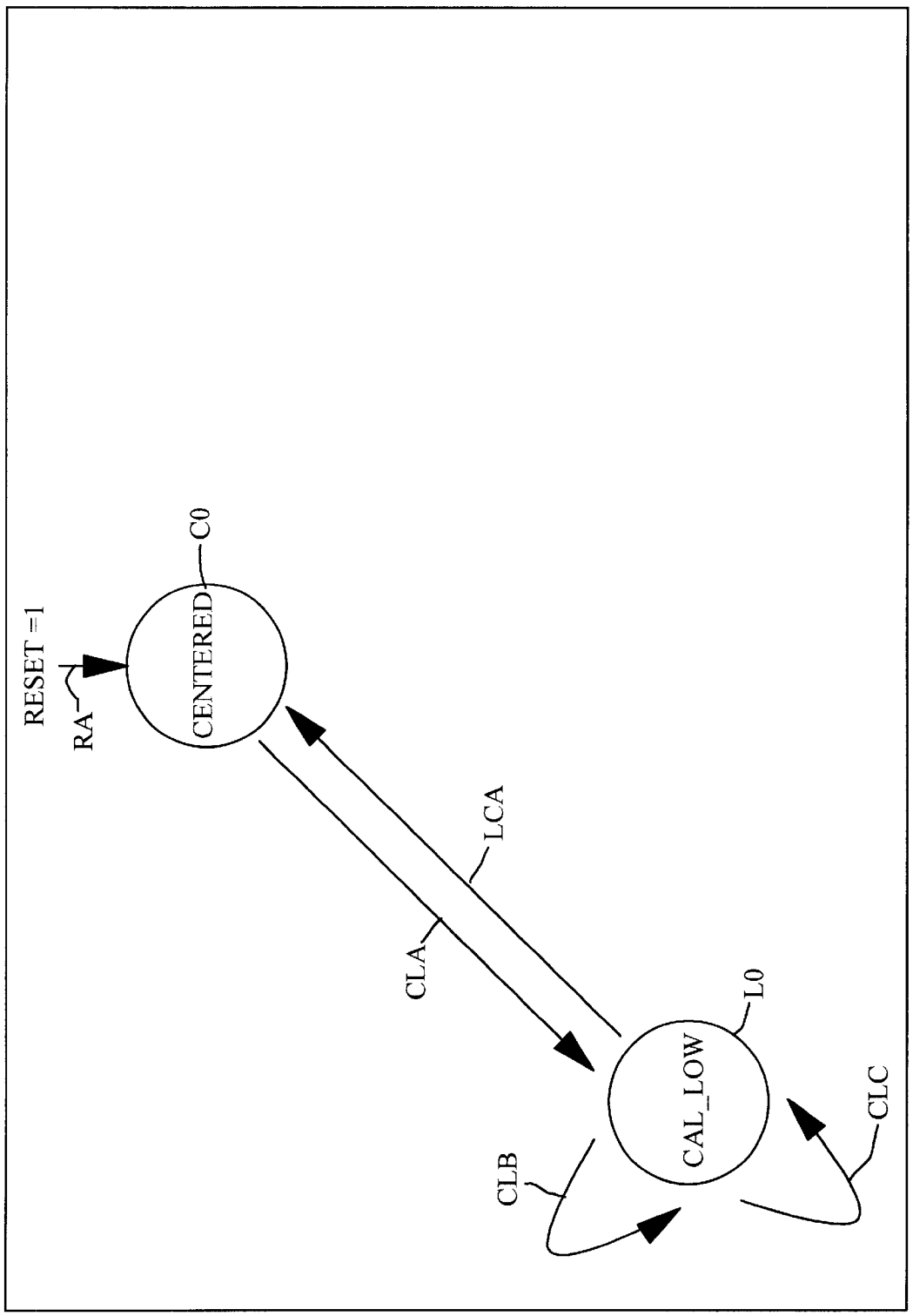
FIG. 6 is a state diagram providing further explanation of the single pass operation of the VCOCTL macro circuit of the DCC.

FIG. 6 shows the VCOCTL macro circuit state diagram for a single pass operation in accordance with FIG. 5. The state diagram begins and moves along vector RA to the centered state C0 with RA vector values, as follows:

RA: RESET=1
  CC_COUNT=000000000
  CC_COMP=0
  CC_ERROR=0

The system moves from CENTERED stated C0 along state diagram vector CLA towards CAL_LOW state L0. The values of vector CLA are as follows:

CLA: (DIFF_HI=1 OR DIFF_POS=1)&&
  CAL_COMP=0
  Inc CC_COUNT+8

The system loops along vector CLB back to CAL_LOW state L0 as follows:

CLB: CC_COUNT<111111111
  && DIFF_POS=1
  Inc CC_COUNT+8
  or CC_COUNT=111111111

The system loops along vector CLC back to CAL_LOW state L0 as follows:

CLC: CC_COUNT=111111111
  &&DIFF_POS=1
  CAL_ERROR=1

The system loops along vector LCA back to CENTERED C0 as follows:

LCA: DIFF_POS=0 &&
  CAL_COMP=1

0.1.4. VCOCTL Macro Circuit Dynamic Operation

Figure 7:
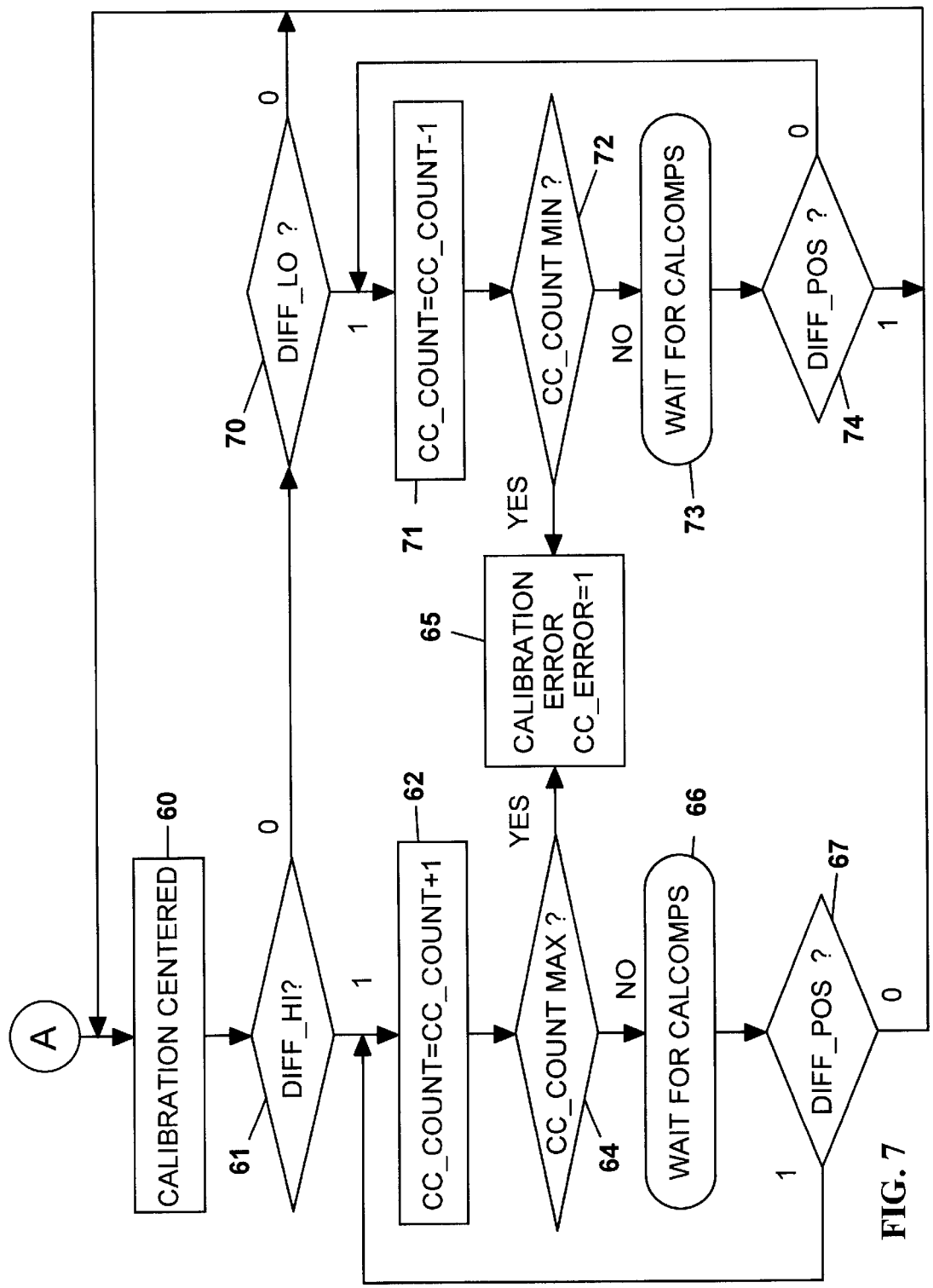
FIG. 7 is a flow chart of the dynamic operation of the VCOCTL macro circuit of the DCC.

The Dynamic operation of the VCOCTL macro circuit, which can be implemented with a microprocessor as will be well understood by those skilled in the art, is explained in detail with reference to FIG. 7. Further explanation is provided below with respect to the corresponding state diagram shown in FIG. 8. In FIG. 7, the system or the microprocessor starts in block 60 by performing the functions as follows:

In block 60, the function performed is as follows:
CALIBRATION CENTERED

Next, the system proceeds to decision block 61 which tests to determine the answer to the question as follows:

Is DIFF_HI "1" or "0"?

If the answer to the test in decision block 61 is "0" then the system proceeds to decision block 70 which tests to determine the answer to the question as follows:

Is DIFF_LO "1" or "0"?

If the answer to the test in block 61 is "0", then the system loops back to the input to block 602 to repeat that function.

If the answer to the test in block 61 is "1", then the system proceeds to the input of block 71 to perform that function which will be discussed below.

Returning to decision block 61, if the answer to the test in decision block 61 is "1" then the system proceeds to the following block 62 where the CC_COUNT is incremented by "1" by the function as follows:

CC_COUNT=CC_COUNT+1

Next, the system proceeds to decision block 64 which tests to determine the answer to the question as follows:

CC_COUNT MAX?

If the answer to the test in block 64 is YES, then the system proceeds to block 65 to perform the function as follows:

CALIBRATION ERROR
CC_ERROR=1

If the answer to the test in block 64 is NO, then the system proceeds to block 66 to perform the function as follows:

WAIT FOR CALCOMPS

This delay also slows the system down to a degree appropriate to permit the continuous cycling of the system to calibrate and recalibrate the VCO continuously without overcorrecting and causing jitter.

Next, the system proceeds to decision block 67 which tests to determine the answer to the question as follows:

Is the state of DIFF_POS "1" or "0"?

If the answer to the test in block 67 is "1", then the system loops back to the input to block 62 to repeat that function.

If the answer to the test in block 67 is "0", then the system loops back to the input of block 60 it to repeat that function, starting the cycle of the algorithm once again.

Returning to decision block 70, as stated above, if the answer to the test in decision block 70 is "1" then the system proceeds to the following block 71 where the CC_COUNT is decremented by "−1" by the function as follows:

CC_COUNT=CC_COUNT−1

Next, the system proceeds to decision block 72 which tests to determine the answer to the question as follows:

CC_COUNT MIN?

If the answer to the test in block 72 is YES, then the system proceeds to block 65 to perform the function as follows:

CALIBRATION ERROR
CC_ERROR=1

If the answer to the test in block 72 is NO, then the system proceeds to block 73 to perform the function as follows:

WAIT FOR CALCOMPS

This delay also slows the system down to a degree appropriate to permit the continuous cycling of the system to calibrate and recalibrate the VCO continuously without overcorrecting and causing jitter.

Next, the system proceeds to decision block 74 which tests to determine the answer to the question as follows:

Is the state of DIFF_POS "1" or "0"?

If the answer to the test in block 67 is "0", then the system loops back to the input to the decision block 71 to repeat that function thereof.

If the answer to the test in block 74 is "1", then the system loops back to the input of block 60 to repeat that function, starting the cycle of the algorithm once again.

Figure 8:
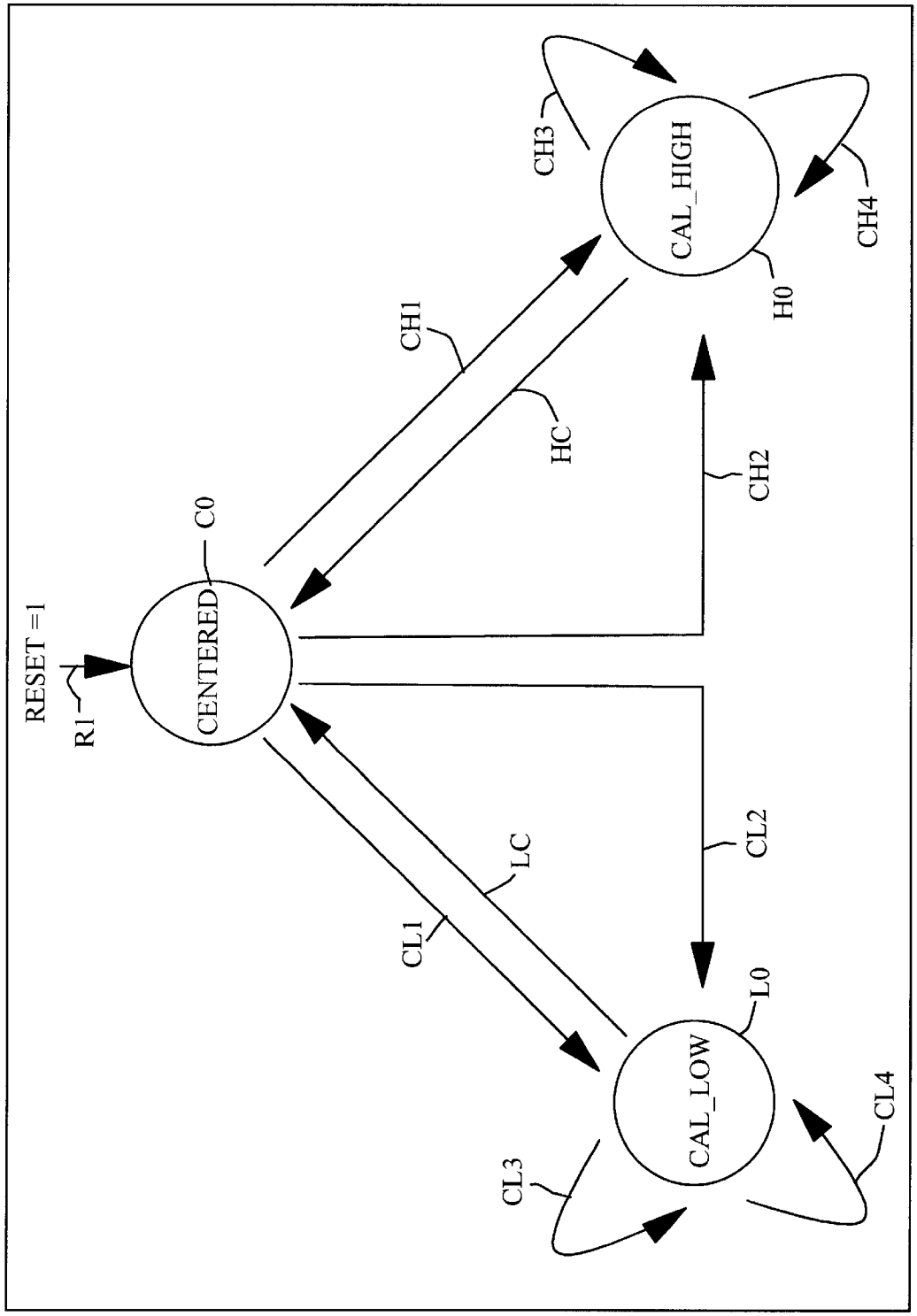
FIG. 8 is a state diagram providing further explanation of the dynamic operation of the VCOCTL macro circuit of the DCC.

FIG. 8 shows the VCOCTL macro circuit state diagram for the dynamic DCC circuit operation in accordance with FIG. 7. In the dynamic operation of the VCOCTL macro circuit in the DCC circuit 22, a continuous attempt to calibrate the VCO is initiated. The CC_COUNT is set to 000000000 when RESET is set high so the VCOCTL macro circuit will increase CC_COUNT by steps of eight until the VCO control voltage is centered (DIFF_POS goes low). Once the VCO control voltage is centered, CC_COMP is set high. After this, if DIFF_LO goes high, CC_COUNT is decremented by a unit step until DIFF_POS goes high; and if DIFF_HI goes high, CC_COUNT is incremented by a unit step until DIFF_POS goes low. In all modes, DIFF_HI has precedence over DIFF_LO. An error signal CC_ERROR is set high if CC_COUNT is 111111111 and DIFF_HI goes high in the Centered state or DIFF_POS is still low in the CAL_LOW state, if CC_COUNT is 000000000 and DIFF_LO goes high in the Centered state or DIFF_POS is still high in the CAL_HIGH state.

The VCOCTL macro circuit state diagram in FIG. 8 for the dynamic DCC circuit begins and moves along vector R1 to the centered state C0 with R1 vector values, as follows:

RI: RESET=1
   CC_COUNT=000000000
   CC_COMP=0
   CC_ERROR=0

In one case, the system moves from CENTERED stated C0 along state diagram vector CL1 towards CAL_LOW state L0. The values of vector CL1 are as follows:

CL1: CC_COUNT<111111111 && (DIFF_HI=1
   OR (DIFF_POS=1)&& CAL_COMP=0))
     Inc CC_COUNT+8
     or CC_COUNT=111111111
   ELSE
     Inc CC_COUNT+1

The system loops along vector CL3 back to CAL_LOW state L0 as follows:

CL3: CC_COUNT<111111111
   && DIFF_POS=1
   IF CALCOMP=0
     Inc CC_COUNT+8
     or CC_COUNT=111111111
   ELSE
     Inc CC_COUNT+1

The system loops along vector CL4 back to CAL_LOW state L0 as follows:

CL4: CC_COUNT=111111111
   &&DIFF_POS=1
   CAL_ERROR=1

The system loops along vector LC back to CENTERED C0 as follows:

LC: DIFF_POS=0
   CAL_COMP=1

The system also moves from CENTERED stated C0 along state diagram vector CL2 towards CAL_LOW state L0. The values of vector CL2 are as follows:

CL2: CC_COUNT=111111111
&& (DIFF_HI=1
CAL_ERROR=1

In another case, the system moves from CENTERED stated C0 along state diagram vector CH1 towards CAL_HIGH state H0. The values of vector CH1 are as follows:

CH1: CC_COUNT>111111111 &&
DIFF_LO=1 && CAL_COMP=1
Dec CC_COUNT−1

The system loops along vector CL3 back to CAL_LOW state L0 as follows:

CH3: CC_COUNT>000000000
&& DIFF_POS=0
Dec CC_COUNT+1

The system loops along vector CL4 back to CAL_LOW state L0 as follows

CH4: CC_COUNT=000000000
&&DIFF_POS=0
CAL_ERROR=1

The system loops along vector HC back to CENTERED C0 as follows:

HC: DIFF_POS=1

The system also moves from CENTERED stated C0 along state diagram vector CL2 towards CAL_LOW state L0. The values of vector CL2 are as follows:

CH2: CC_COUNT=000000000
&& DIFF_LO=1
&& CAL_COMP=1
CAL_ERROR=1

| VCOCTL Macro Circuit State Diagram for Dynamic Operation Centered C0, CAL_LOW L0, CAL_HIGH H0 | |
|---|---|
| FUNCTION | ACTIONS |
| R1 | RESET = 1<br>CC_COUNT = 000000000, CC_COMP = 0,<br>CC_ERROR = 0 |
| CL1 | CC_COUNT < 111111111 && (DIFF_HI = 1<br>OR (DIFF_POS = 1 && CAL_COMP = 0))<br>IF CAL_COMP = 0, Inc CC_COUNT + 8<br>or CC_COUNT = 111111111<br>ELSE Inc CC_COUNT + 1 |
| CL2 | CC_COUNT = 111111111, && DIFF_HI = 1<br>CAL_ERROR = 1 |
| CL3 | CC_COUNT < 111111111, && DIFF_POS = 1<br>IF CAL_COMP = 0, Inc CC_COUNT + 8<br>or CC_COUNT = 111111111<br>ELSE Inc CC_COUNT + 1 |
| CL4 | CC_COUNT = 111111111, && DIFF_POS = 1<br>CAL_ERROR = 1 |
| CH1 | CC_COUNT = 000000000<br>&& DIFF_LO = 1 && CAL_COMP = 1<br>Dec CC_COUNT − 1 |
| CH2 | CC_COUNT > 000000000, && DIFF_LO = 1, &&<br>CAL_COMP = 1 CAL_ERROR = 1 |
| CH3 | CC_COUNT = 000000000, && DIFF_POS = 0<br>Dec CC_COUNT − 1 |
| CH4 | CC_COUNT > 000000000, && DIFF_POS = 0<br>CAL_ERROR = 1 |
| HC | DIFF_POS = 1 |

0.1.5. Serial AT Bus Attachment (Serial ATA) Slumber Mode

If the SLUMBER input is set to high, slumber mode is initiated. When entering this mode, all state transitions and CC_COUNT changes are halted until a set time (~1600 μs) after the SLUMBER input goes low. Once this time interval is reached, calibration counting is incremented/decremented by steps of eight until such time that DIFF_HI and DIFF_LO are both zero, after which time counting continues by steps of one. Note that Serial AT Bus Attachment (Serial ATA) is the dominant storage interface for personal computers. ATA was originally defined as a standard for embedded fixed disk storage on IBM AT™ compatible personal computers, where AT is an acronym for Advanced Technology referring to the 16 bit bus employed in the IBM PCAT™ computer.

0.1.6. Testing

The VCOCTL macro circuit is designed to be compliant with IBM's LSSD test methodology. Its test structure is verified with IBM's EDA TestBench tool and tests can be generated to cover 100% LSSD test coverage. Inputs SCANGATE is used to disable all clocks to the oscillator inputs of the clock splitters. The LSSDB and LSSDC1 clocks are used during LSSD testing and are held high for functional operation.

| 0.1.7. VCOCTL Macro Circuit Inputs | | |
|---|---|---|
| Signal Name | Source | Description |
| DIFF_HI | Analog | This signal tells the VCOCTL macro circuit to increment the CC_COUNT. Note, should not be high when DIFF_POS is low. |
| DIFF_LO | Analog | This signal tells the VCOCTL macro circuit to decrement the CC_COUNT. Note, should not be high when DIFF_POS is high. |
| DIFF_POS | Analog | This signal tells the VCOCTL macro circuit when the VCO differential control voltage passes the zero point of the desired frequency. It is high when there is a positive control voltage and low when there is a negative control voltage |
| DYNAMIC-EN | External | This signal enables dynamic operation. |
| INCC | Corecntl | Increments the CC_COUNT by one (used for dynamic mode testing). |
| LSSDA | Corecntl | LSSDA clock is positive active. When TESTMODE is high, this input is used to clock the logic. When TESTMODE is low, this clock is forced low. |
| LSSDB<br>LSSDC | Corecntl | Positive active LSSD clocks. When TESTMODE is high, these inputs are used to clock the logic. When TESTMODE is low, these clocks are forced high. |
| SCANGATE | Corecntl | When SCANGATE is high, the LSSD clocks are used instead of the system clocks. This is used during manufacturing test to check for stuck faults. SCANGATE is low in nom 1 al operation and during module BIST testing. |
| SCANIN | Corecntl | LSSD scan data input. |
| REFCLK | External | 33.3 MHz reference clock from the analog partition. |
| RESET | Corecntl | This signal resets the state of the VCOCTL macro circuit when high. |
| SLUMBER | Link | When SLUMBER goes high, the VCOCTL macro circuit enters the slumber state and stays there until a set interval ~1600 μs after SLUMBER goes low. |

| 0.1.8. VCOCTL Macro Circuit Outputs | | |
|---|---|---|
| Signal Name | Destination | Description |
| CC_COMP | Corecntl | Signals that VCOCTL macro circuit has completed the first calibration when high. |
| CC_COUNT (8:0) | Analog,<br>Corecntl | The six bit coarse calibration count value. Zero is the least significant bit. |
| CC_ERROR | Corecntl | Denotes if there is a calibration error. |

-continued

| | | |
|---|---|---|
| CALCOMPS_PD | Analog | Powers down the CALCOMPS system 20 by going high for all but 80 of the 31,250 cycles between sampling of the DIFF_HI, DIFF_LO, and DIFF_POS inputs (75 cycles before and 5 afterwards). |
| SCANOUT | Corecntl | LSSD scan data output. |

0.1.9. VCOCTL Macro Circuit Electrical Characteristics

| Parameter | Description | Min | Typ | Max | Units | Notes |
|---|---|---|---|---|---|---|
| Vdd | Power Supply | 1.80 | 1.60 | 1.95 | volts | 1 |
| Tj | Junction Temperature | 0 | 70 | 125 | ° C. | |
| Pw | Power Dissipation | | | 0.071 | mW | 2 |
| fclk | LREFCLK Frequency | | | 33.3 | MHZ | |
| Cload | Capacitive load on output | | | 0.2 | pF | |
| Cin | Capacitance of input | | | 0.5 | pF | |

1 Power requirements based on CMOS7SF technology.
2 Calculated as 0.02 uW/MHz/gate @ 1.95 V.

FIG. 9 is a circuit diagram of a Differential Low Pass Filter (DLPF) 18 adapted for use in the system of FIG. 1. The FILTP (up) output from the charge pump 15 on line 15A is supplied to line 16A in the DLPF 18. The FILTN (down) output from the charge pump 15 on line 15B is supplied to line 16B in the DLPF 18. Capacitor C2 which is connected between lines 16A and 16B to filter out the high frequencies is connected in parallel with a connection of series three elements comprising resistor R1, capacitor C1 and resistor R2 which provide the differential voltage output on lines 18A/18B as the input lines 16A and 16B swing either positive or negative with respect to the FILTP/FILTN charge pump output currents which alternately swing either positive or negative. See the commonly assigned U.S. Pat. No. 6,422,402 of Boerstler et al. for "Differential Charge-Pump with Improved Linearity" which shows an example of a charge pump with positive and negative outputs in a PLL application.

Figure 10:
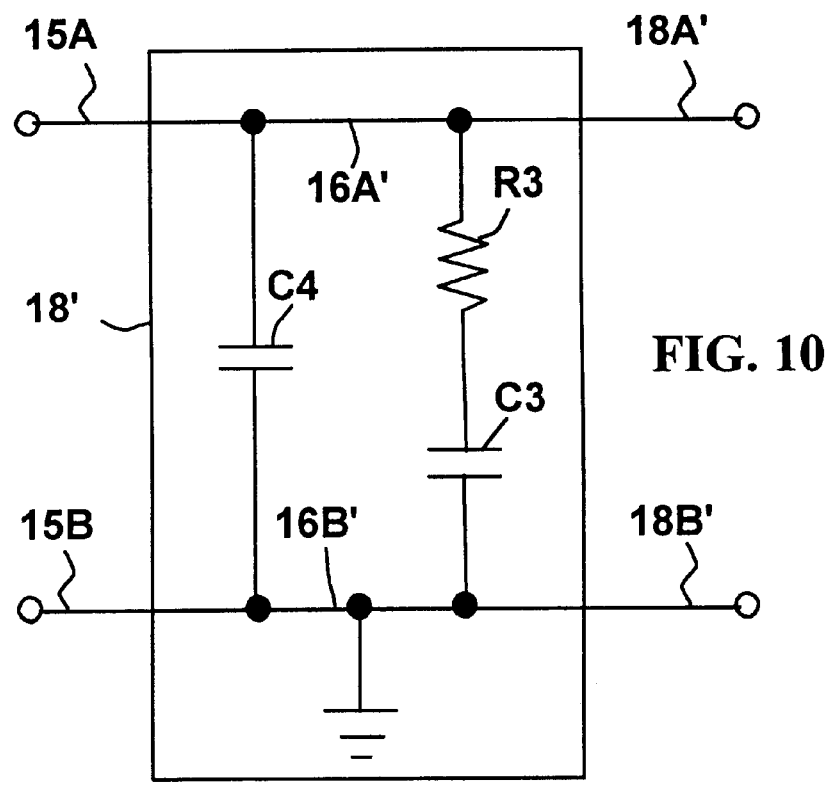
FIG. 10 is a circuit diagram of a Single Low Pass Filter (LPF) adapted for use in the system of FIG. 1 as an alternative to the DLPF.

FIG. 10 is a circuit diagram of a Low Pass Filter (LPF) adapted for use in the system of FIG. 1 as an alternative to the DLPF of FIG. 9. As in the case of FIG. 9, the FILTP (up) output from the charge pump 15 on line 15A is supplied to line 16A' in the LPF 18'. The FILTN (down) output from the charge pump 15 on line 15B is supplied to line 16B' in the LPF 18'. A capacitor C4 between lines 16A' and 16B' filters out the high frequencies. In parallel with the capacitor C4 are resistor R3 and capacitor C3 connected in series to provide a variable voltage thereacross as line 16A swings up and down with respect to line 15B.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A calibration system for a Phase Locked Loop (PLL) comprising:
   a low pass filter for providing a filtered error signal to a voltage controlled oscillator (VCO) and a comparator system,
   the comparator system including a high error comparator, a low error comparator and a positive-negative error comparator,
   the comparator system providing an overlimit output indicating when the polarity of the error signal exceeds a positive limit or a negative limit, and
   a calibration means for providing incremental calibration input to the VCO after a time delay,
   whereby the frequency of the VCO in the PLL is corrected to compensate for frequency drift without jitter.

2. A calibration system in accordance with claim 1 wherein the calibration means determines when an overlimit output has been received and then adjusts the calibration input.

3. A calibration system in accordance with claim 1 wherein:
   the calibration means samples the output of the comparator system at sampling times and then determines when an overlimit output has been received and then adjusts the calibration input.

4. A calibration system in accordance with claim 1 wherein:
   the calibration means samples the output of the comparator system at sampling times, then determines when an overlimit output has been received, and then adjusts the calibration input by a small increment followed by powering down the comparator system for a delay time.

5. A calibration system in accordance with claim 1 wherein:
   the calibration means begins a calibration cycle by sampling the output of the comparator system at sampling times, then determines when an overlimit output has been received, then adjusts the calibration input by a small increment, and then powers down the comparator system for a delay time, and
   the calibration means determines whether the calibration has corrected a detected error and repeats the correction cycle until correction of the error has been detected followed by returning to the beginning of the calibration cycle.

6. A calibration system in accordance with claim 5 wherein the calibration means includes a Dynamic Course Correction (DCC) circuit and a Digital to Analog (DAC) converter.

7. A calibration system in accordance with claim 6 wherein the Digital to Analog (DAC) converter includes means delaying the rate of change of incremental calibration input to the VCO.

8. A calibration system in accordance with claim 5 wherein:
   the VCO comprises a voltage to current (V-I) converter connected to provide an input to a current controlled oscillator (ICO),
   the calibration means includes a Dynamic Course Correction (DCC) circuit and a Digital to Analog Converter (DAC) and the DAC provides an input to the ICO.

9. A calibration system in accordance with claim 8 wherein the DAC includes means delaying the rate of change of incremental calibration input to the ICO.

10. A calibration system for a Phase Locked Loop (PLL) comprising:
    a phase/frequency detector coupled to the output of a voltage controlled oscillator (VCO) and to a source of a reference frequency,
    a charge pump connected to receive an error signal from the phase/frequency detector and provide a voltage to a low pass filter,
    the low pass filter providing a filtered error signal to the VCO and to a comparator system, the comparator system providing a comparator output indicating when the polarity of the error signal exceeds a positive limit or a negative limit, and a calibration means for continuously providing incremental calibration input to the VCO after a time delay, whereby the frequency of the VCO in the PLL is continuously corrected to compensate for frequency drift and avoid jitter caused by an excessive rate of response to calibration inputs.

11. A calibration system in accordance with claim 10 wherein the comparator system includes a high error comparator, a low error comparator and a positive-negative error comparator.

12. A calibration system in accordance with claim 10 wherein the calibration means determines when an overlimit output has been received and then adjusts the calibration input.

13. A calibration system in accordance with claim 10 wherein:

the comparator system includes a high error comparator, a low error comparator and a positive error output, and the calibration means samples the output of the comparator system at sampling times and then determines when an overlimit output has been received and then adjusts the calibration input.

14. A calibration system in accordance with claim 10 wherein:

the comparator system includes a high error comparator, a low error comparator and a positive-negative error comparator, and the calibration means samples the output of the comparator system at sampling times and then determines when an overlimit output has been received and then adjusts the calibration input by a small increment followed by powering down the comparator system for a delay time.

15. A calibration system in accordance with claim 10 wherein:

the comparator system includes a high error comparator, a low error comparator and a positive-negative error comparator, the calibration means begins a calibration cycle by sampling the output of the comparator system at sampling times and then determines when an overlimit output has been received and then adjusts the calibration input by a small increment followed by powering down the comparator system for a delay time, and the calibration means determining whether the calibration has corrected a detected error and repeating the correction cycle until correction of the error has been detected followed by returning to the beginning of the calibration cycle.

16. A calibration system in accordance with claim 15 wherein the calibration means includes a Dynamic Course Correction (DCC) circuit and a Digital to Analog (DAC) converter.

17. A calibration system in accordance with claim 16 wherein the Digital to Analog (DAC) converter includes means delaying the rate of change of incremental calibration input to the VCO.

18. A calibration system for a Phase Locked Loop (PLL) comprising:

a phase/frequency detector coupled to the output of a voltage controlled oscillator (VCO) and to a source of a reference frequency, the VCO comprising a voltage to current (V-I) converter connected to provide an input to a current controlled oscillator (ICO), a charge pump connected to receive an error signal from the phase/frequency detector and provide a voltage to a low pass filter, the low pass filter providing a filtered error signal to the VCO and to a comparator system, the comparator system providing a comparator output indicating when the polarity of the error signal exceeds a positive limit or a negative limit, a calibration means for continuously providing incremental calibration input to the VCO after a time delay, the calibration means including a Dynamic Course Correction (DCC) circuit and a Digital to Analog Converter (DAC) and the DAC provides an input to the ICO, the calibration means beginning a calibration cycle by sampling the output of the comparator system at sampling times and then determining when an overlimit output has been received and then adjusts the calibration input by a small increment followed by powering down the comparator system for a delay time, and the calibration means determining whether the calibration has corrected a detected error and repeating the correction cycle until correction of the error has been detected followed by returning to the beginning of the calibration cycle, whereby the frequency of the VCO in the PLL is continuously corrected to compensate for frequency drift and avoid jitter caused by an excessive rate of response to calibration inputs.

19. A calibration system in accordance with claim 18 wherein the DAC includes means delaying the rate of change of incremental calibration input to the ICO.

* * * * *